United States Patent [19]
Todd

[11] Patent Number: 4,844,324
[45] Date of Patent: Jul. 4, 1989

[54] SOLDER SYSTEM AND METHOD OF USING SAME

[76] Inventor: Thomas W. Todd, 10161 Royal Ann Ave., San Diego, Calif. 92126

[21] Appl. No.: 102,478

[22] Filed: Sep. 29, 1987

[51] Int. Cl.⁴ ............................................ H05K 13/04
[52] U.S. Cl. .................................. 228/180.2; 228/6.2; 29/743
[58] Field of Search ................... 228/180.2, 6.2, 44.7, 228/47; 29/743, 760

[56] References Cited

U.S. PATENT DOCUMENTS

| | | | |
|---|---|---|---|
| 3,357,091 | 12/1967 | Reissmueller | 228/180.2 |
| 3,641,648 | 2/1972 | Kalberman | 29/743 |
| 3,776,447 | 12/1973 | Adams | 29/760 |
| 3,843,036 | 10/1974 | Monahan | 228/6.2 |
| 3,872,566 | 3/1975 | Pedrotti | 228/6.2 |
| 4,010,885 | 3/1977 | Keizer | 228/6.2 |
| 4,039,114 | 8/1977 | Yoshida | 228/6.2 |
| 4,132,341 | 1/1979 | Bratschum | 228/180.2 |
| 4,550,871 | 11/1985 | Chan | 228/180.2 |
| 4,720,035 | 1/1988 | Isogai | 228/180.2 |
| 4,722,135 | 2/1988 | Read | 29/743 |
| 4,731,923 | 3/1988 | Yagi et al. | 228/6.2 |
| 4,735,354 | 4/1988 | Yagi et al. | 228/180.2 |
| 4,747,198 | 5/1988 | Asai et al. | 29/760 |
| 4,753,004 | 6/1988 | Fujioka | 29/743 |

OTHER PUBLICATIONS

IBM Technical Disclosure Bulletin, vol. 21, No. 12, May 1979, p. 5005.

Primary Examiner—Kurt Rowan
Attorney, Agent, or Firm—Bernard L. Kleinke; Jerry R. Potts; William Patrick Waters

[57] ABSTRACT

A solder system is adapted for use in soldering the terminals of a plurality of circuit boards, to corresponding leads of a plurality of cables. The solder system includes a holding fixture for supporting adjustably the circuit boards relative to the corresponding cables. A gripper assembly retains the cable leads in position above the corresponding board terminals. A monitor assembly is utilized to supervise optically the various stages of the soldering process. A heater assembly is mounted adjustably above the holding fixture for reflowing the solder material over the aligned cable leads and board terminals.

24 Claims, 5 Drawing Sheets

SOLDER SYSTEM AND METHOD OF USING SAME

DESCRIPTION

TECHNICAL FIELD

The present invention generally relates to solder devices and techniques. It relates more particularly to a reflow solder system and a method of using it, for soldering fine pitched cable leads to printed circuit board terminals or other points of connection, as well as for soldering surface mounted leads and like components to a printed circuit board.

BACKGROUND ART

Conventional solder systems of the general type with which the present invention is concerned, are employed for soldering ribbon cable leads to the terminals of printed circuit boards. The conventional solder system frequently includes a fixture for retaining the printed circuit board to be soldered, and another fixture positions the ribbon cables leads against the terminals of the printed circuit board. A heater element applies heat to the solder material, to cause it to flow and then to bind the cable leads and the board terminals.

However, with the ever increasing miniaturization of semiconductor integrated circuitry, the degree of tolerance for the pitch between the finely-spaced, hairlike cable leads and the mating board terminals has been substantially reduced. In this regard, the fine pitch requirement for modern integrated circuitry, can not generally be satisfied readily and efficiently by conventional solder devices, in that the alignment of the cable leads with the corresponding board terminals has become increasingly difficult, and in some cases impossible, to achieve by the use of conventional fixtures, prior to the soldering operation. As a result, prior known solder devices have not been entirely satisfactory for many modern applications. The decreased level of accuracy has lead to an alarming high percentage of rejected components, due to improper connection of misaligned leads.

While the foregoing alignment problem can be cured to some extent manually, such solution has proven to be time consuming and inefficient. Additionally, the removal and repair of the improperly soldered components have proven to be less than totally satisfactory, in that they are costly, awkward and time consuming. Hence, the most economical conventional solution to the improper alignment and soldering problems to date, has been to generally discard the defective printed circuit boards, cables and components, rather than to attempt to rectify such problems. In fact, where an improperly soldered ribbon cable electrically interconnects a pair of printed circuit boards, both boards and the cable oftentimes must be discarded.

Therefore, there is a need for a solder system and method of using it, for minimizing, if not totally eliminating, the alignment problems associated with the soldering operation. In this manner, such a solder system should provide a more efficient and effective soldering operation than the conventional soldering devices. The solder system should tolerate the finer pitch alignment of the modern integrated circuitry applications, and it should further enable the user to rectify the improper alignment between the cable leads and the board terminals, prior to affixing the leads in place.

Conventional solder systems, have also been designed to connect surface mounted lead components, such as integrated circuit chips, and hybrid circuit chips, to a printed circuit board. The soldering of different components on a circuit board is generally carried by refixturing the solder system for each type of components, or in the alternative, by using a different solder system for each type of component. Such operation has proven to be time consuming, and thus in some instances prohibitively expensive.

Therefore, there is a need for a solder system and method of using it, for connecting surface mounted lead components to printed circuit boards, without refixturing or changing the solder system, as well as for minimizing the alignment problems associated with the soldering operation of cable and component leads to circuit board terminal leads.

Another problem related to the use of the conventional soldering machines, is the difficulty of reflowing the solder in a precise and proper manner. In this regard, a heating element is generally lowered into a parallel position relative to the printed circuit board, for heating and reflowing the solder to cause it to bind the desired components.

However, in many instances, the heater is positioned improperly relative to the components. Thus, the improper positioning of the heater relative to the rigid fixtures retaining the circuit board and the cable, causes an uneven distribution and application of heat to the solder. Thus, the solder material is not completely and properly heated to a sufficiently flowable condition, for either affixing the leads together or disconnecting them.

Therefore, it would be highly desirable to have a solder system and a method of using it, for minimizing the finer pitch problems associated with the alignment operation of the cable and component leads and board terminals. Furthermore, the solder machine should enable various types of surface mounted lead components to be soldered to the circuit boards without refixturing or otherwise modifying the solder machine. The solder machine should enable the effective connection or removal of the cables, as well as surface mounted lead components, to or from the circuit boards.

DISCLOSURE OF INVENTION

Therefore, it is an object of the present invention to provide a new and improved solder system, and a reflow solder method connecting or removing cable and component leads to or from printed circuit board terminals in a fast and efficient manner.

Briefly, the above and further objects and features of the present invention are realized by providing a new and improved solder system and a reflow soldering method for connecting or disconnecting cable and component leads to printed circuit board terminal leads. The solder system generally includes a holding fixture for supporting adjustably the circuit boards relative to the corresponding cables. A gripper assembly retains the cable leads in position above the corresponding board terminals. A monitor assembly is utilized to supervise optically the various stages of the soldering process. A heater assembly is mounted adjustably above the holding fixture for reflowing the solder material over the aligned cable leads and board terminals.

Thus, the present inventive solder system enables the soldering of fine pitched cable and component leads to printed circuit board terminal leads. It also enables the soldering of surface mounted component leads to printed circuit boards. Additionally, the solder system enables the cable to be disconnected, and the components to be removed from the circuit boards.

Furthermore, by monitoring continuously the leads and terminals being soldered, prior to reflowing the solder material, the user can adjust the holding fixture so as to attain an optical alignment of the leads and terminals. Hence, the number of rejected parts due to improper alignment is greatly reduced, if not eliminated. The soldering process is accelerated, and rendered more efficient.

BRIEF DESCRIPTION OF DRAWINGS

The above mentioned and other objects and features of this invention and the manner of attaining them will become apparent, and the invention itself will be best understood by reference to the following description of the embodiments of the invention in conjunction with the accompanying drawings, wherein.

BEST MODE FOR CARRYING OUT THE INVENTION

Figure 1:
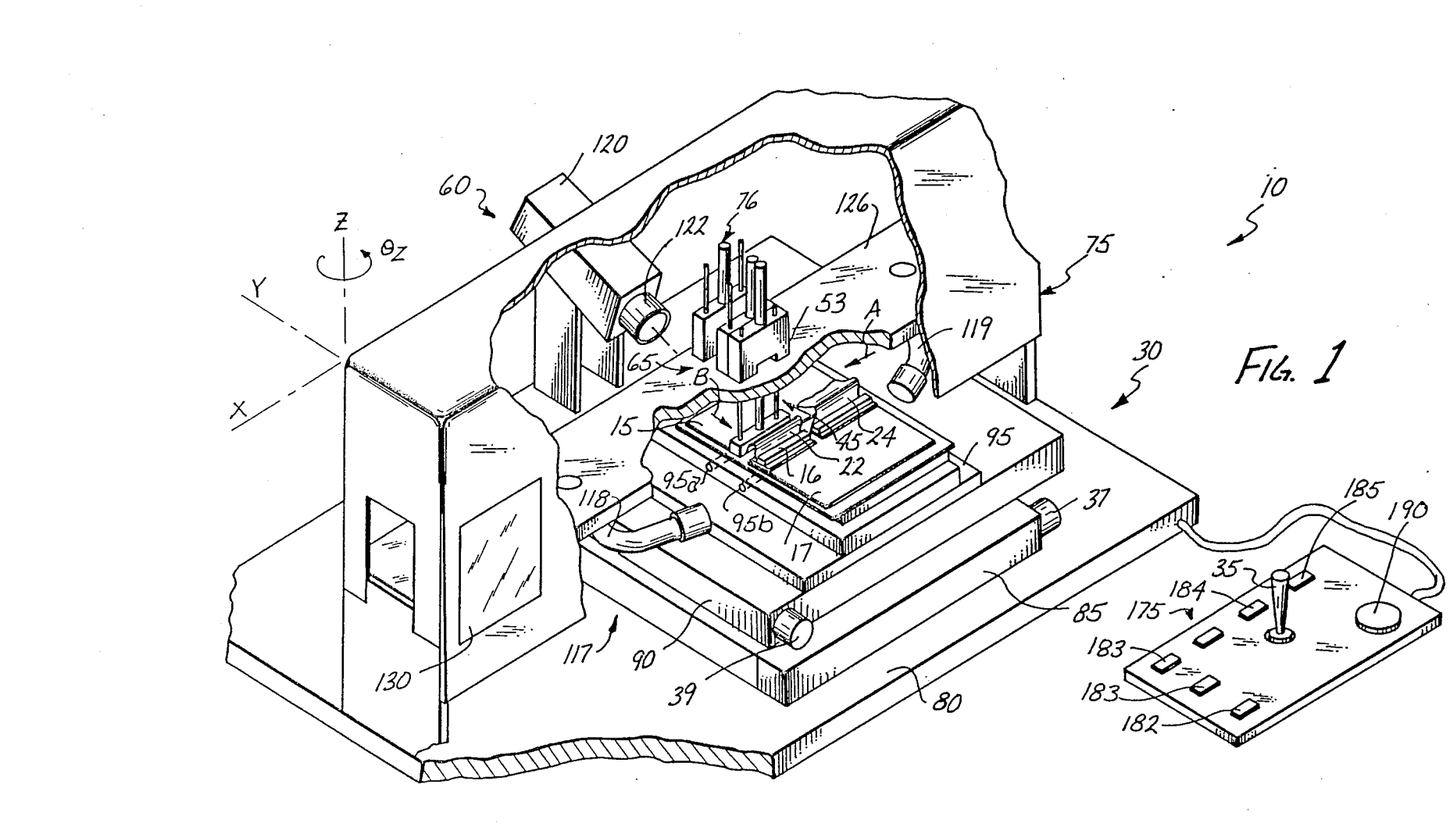
FIG. 1 is a partially broken away, pictorial view of a solder system, which is constructed in accordance with the present invention, and which is shown in use for interconnecting two printed circuit boards via a pair of ribbon cables, with a gripper assembly being illustrated in its lowermost position retaining one end of one cable in soldering position in engagement with one of the boards.
Figure 2:
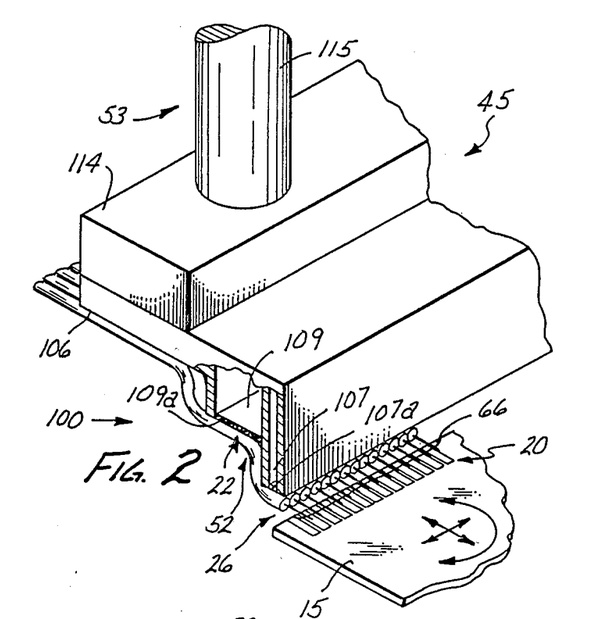
FIG. 2 is an enlarged fragmentary, partially broken away pictorial view of a gripper assembly which forms a part of the solder system of FIG. 1, as viewed from the direction of an arrow A of FIG. 1, and which is shown in a hover position above a circuit board.

Turning now to the drawings, and more particularly to FIGS. 1 and 2 thereof, there is shown a solder system 10 which is adapted for use in soldering the terminals of a pair of printed circuit boards 15 and 17, such as the terminals 20 (FIG. 2) of the printed circuit board 15, to the leads of a pair of ribbon cables 22 and 24, such as the ribbon cable leads 26 (FIG. 2) of the ribbon cable 22.

For illustration purposes only, the system 10 is shown in use for interconnecting two printed circuit boards 15 and 17, by a pair of ribbon cables 22 and 24. However, it will become apparent to those skilled in the art, after reviewing the following description, that a larger number of printed circuit boards can be interconnected by a different numbers of ribbon cables, or a single board can be connected to a cable.

The system 10 generally comprises a holding fixture or assembly 30 for supporting adjustably the printed circuit boards 15 and 17 in a side-by-side co-planar relationship, relative to the ribbon cables 22 and 24 extending therebetween. For the purpose of positioning the printed circuit boards 15 and 17, and more particularly the alignment of their terminals, such as the terminal 20, relative to the leads of the ribbon cables 22 and 24, such as the lead 26 of the ribbon cable 22, the fixture or assembly 30 is provided with three directions of movement in the X, Y and $\theta_z$ directions, as indicated by the arrows in FIG. 1. Control devices, such as a joystick 35 for the $\theta_z$ direction, X direction and Y direction. Alternatively, a knob 37 also controls the X direction, and a knob 39 controls the Y direction, to enable the user to make coarse as well as fine adjustments positionally to the holding fixture or assembly 30, in the foregoing three directions, for alignment purposes. Thus, either the joystick or the control knobs can be used for the X and Y directions.

In preparation for the soldering thereof to the board 15 and 17, a vertically movable gripper assembly 45 retains either end of the ribbon cable 22 to the boards 15 and 17 in position. Since the fixture or assembly 30 moves positionally the boards and cables relative to the vertical path of travel of the gripper assembly, the gripper assembly is also used to secure either end of the cable 24 to the boards 15 and 17. A clamp 16 holds the central portion of the cable 22 against the fixture or assembly 30, for preventing it from shifting during the soldering operation.

As shown in FIG. 2, the gripper assembly 45 includes a suction head generally indicated at 50, for securing releaseably the cable 22, and a pneumatic mechanism 53 moves the head 50 through its vertical path of travel toward and away from the fixture or assembly 30. The gripper assembly 45 retains the ribbon cable 22 in position, while the printed circuit board 15 is positionally adjusted relative thereto, to align the cable leads and the board terminals.

The gripper assembly 45 can be moved vertically between a plurality of discrete preset positions. While three positions will hereinafter be described, it should be understood that other positions may be utilized depending on the nature of the particular application of the system 10.

The gripper assembly 45 is lowered a short distance from its rest position, to a first or uppermost position (not shown), which is generally referred to as the loading position, where the cable 22 is loaded onto the assembly 45, and is retained by the suction head 50 at a substantial distance above the printed circuit board 15.

The next position of the gripper assembly 45 is illustrated in FIG. 2, and is generally referred to as the hover or intermediate position, where the cable 22 is lowered to a short distance above the printed circuit board 15. At the hover position, the alignment of the terminals 20 and the leads 26 is inspected visually, and positional adjustments can be made and monitored visually, by a monitor assembly 60.

Figure 3:
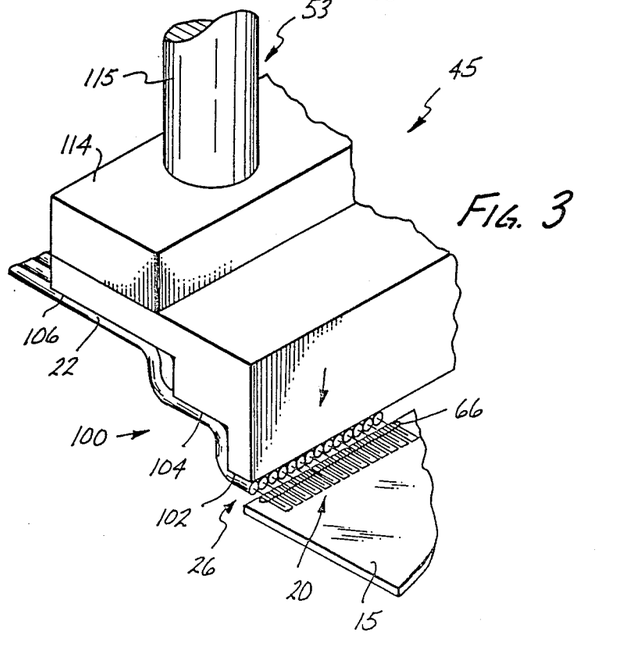
FIG. 3 is an enlarged pictorial fragmentary partially broken away view of the gripper assembly of FIG. 2, shown in a solder position.

As shown in FIG. 3, the third position of the gripper assembly 45 is the lowermost or soldering position, where the leads 26 are held and retained in proper alignment in engagement with the terminals 20, in preparation for the soldering operation.

As illustrated in FIG. 1, the monitor assembly 60 is used to supervise optically the various stages of the soldering operation, and more particularly the alignment of the leads 26 and the terminals 20 prior to the soldering stage. In this manner, the overall efficiency and effectiveness of the soldering operation is improved substantially, and the system 10 is generally rendered compatible for modern applications.

Figure 4:
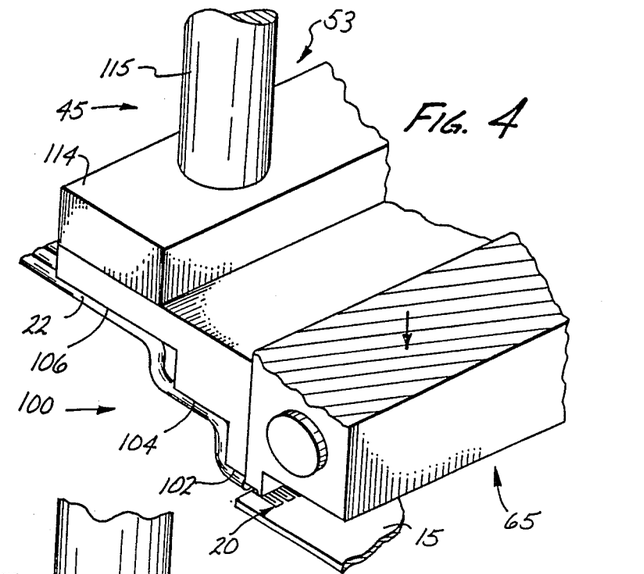
FIG. 4 is a greatly enlarged fragmentary view of a heater assembly which forms a part of the solder system of FIG. 1, and which is shown in use which the gripper assembly of FIG. 3.
Figure 5:
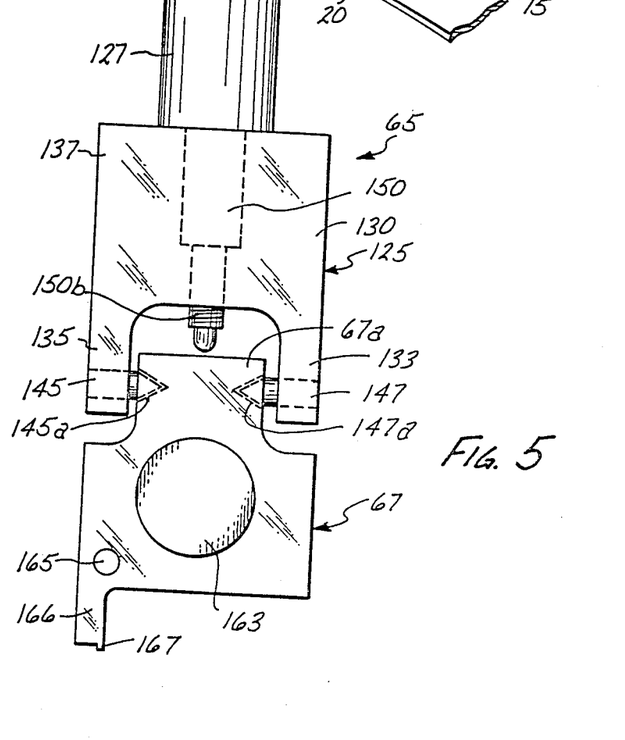
FIG. 5 is a greatly enlarged fragmentary side elevational view of the heater assembly of FIG. 4.

As illustrated in FIGS. 1, 3 and 4, a heater assembly 65 is mounted adjustably above the holding fixture or assembly 30, adjacent to the gripper assembly 45, for heating a solder bead 66, and for causing it to reflow, in order to bind the terminals 20 and the leads 26. As illustrated in FIG. 5, for the purpose of causing the heater assembly 65 to be positioned in proper alignment with respect to the leads 26 and the terminals 20, the heater assembly 65 includes a floating gimballed head 67 engages a solder bead of a schematically-shown solder comb 66, extending transversely over the leads 26, and thus the terminals 20. The solder comb 66 is a device sold under the tradename "SOLDER QUICK" by the Ray-Chem Company, and includes a series of spaced apart fingers or teeth (not shown) composed of kapton material which does not adhere to solder and thus allows the molten solder to drop therethrough and onto the terminals.

As illustrated in FIG. 1, a vertically moveable mounted pick and place device 76 is mounted adjacent to the heater assembly 65, for connecting surface mounted or like components (not shown) on the printed circuit boards 15 and 17. The components are loaded and stored in a feed magazine (not shown). The pick and place device 76 selects the desired component from the feed magazine, and positions the component on the board, such as the board 15, where the component is soldered in place by the device 76. The device 76 operates sequentially through three positions, in a similar manner as the previously described ribbon gripper assembly 45.

The device 76 moves in a vertical path of travel relative to the upper board supporting surface of the fixture or assembly 30, which enables the board to be moved to the path of travel of the device 30. In this manner, the device 76 moves reciprocatively to mount components onto the boards 15 and 17. The monitor assembly 60 is also used to inspect visually the pick and place operation as well. The components are then soldered to the board by the reflow solder technique using the heater assembly 65, after the holding assembly positions the components relative thereto.

A housing 75 fits over and covers partially, and protects the gripper assembly 45, the heater assembly 65, and the pick and place device 76. The shielding provided by the housing 75 facilitates the proper optical monitoring of the alignment and soldering operations.

In operation, the printed circuit boards 15 and 17 are placed on the holding fixture or assembly 30. In order to solder one end of the cable 22 to the board 15, the gripper assembly 45 is then lowered to the loading position (not shown), where one end portion of the ribbon cable 22 is loaded manually into gripping engagement with the suction head 50. Thereafter, the gripper assembly 45 is lowered still further to the hover position (FIG. 2), where the position of the terminals 20 is adjusted until they are directly below and in registration with the leads 26. Such positional adjustment is achieved by means of the control devices, such as the joystick 35 and the knobs 37 and 39 for causing the fixture or assembly 30 to be moved by its suitable drive motors (not shown).

The monitor assembly 60 provides an enlarged visual presentation of the alignment and soldering stages. The joystick 35 is manipulated, for causing the holding fixture or assembly 30 to move in the desired angular $\theta_z$ direction, while the knobs 37 and 39 cause the holding fixture or assembly 30 to be moved in the desired rectilinear X and Y directions, respectively. As shown in FIG. 3, when the desired alignment of the cable leads and the board terminal is achieved as visualized on the monitor 130, the gripper assembly 45 is lowered to the soldering position and thus carries the conductor ends of the cable 22 into proper engagement with corresponding one of the terminals 20. The holding fixture or assembly 30 is locked into a fixed position by means (not shown), or the torque provided by the motor (not shown).

Subsequently, the heater assembly 65, which is preheated to a predefined temperature, is lowered and applied against the solder bead of the solder comb 66 for a predetermined length of time, for heating the solder to a molten condition. Once the solder material is subsequently cooled to cause it to rigidify, the gripper assembly 45 is released and retracted to its original rest position, where the solder comb is removed by means (not shown).

Substantially similar soldering steps are followed when surface mounted lead components (not shown) are to be connected to the circuit board 15, with the exception that the pick and place device 76, rather than the gripper assembly 45, is caused to retain and to position the selected components onto the board 15.

Considering now the board holding fixture or assembly 30 in greater detail with respect to FIG. 1, it generally comprises a base 80 for supporting the system 10 on a substantially flat surface (not shown). A power driven X-table 85 is moveably mounted on the base plate 80, and is controlled by the knob 37, for causing the table 85 to be moved linearly in the X direction by suitable means (not shown). It will become apparent to those skilled in the art that a manual table may also be employed, in place of the power driven table.

A power driven Y-table 90 is moveably mounted above the X-table 85, and is controlled by the knob 39, to cause the table 90 to move linearly in the Y direction by suitable means (not shown). A power-driven rotatably-mounted turntable 95 is mounted atop the Y-table 90, and supports the printed circuit boards 15 and 17 in a flat, generally horizontal co-planar position.

A pair of heading rods 95A and 95B extend transversely in respective openings in the turntable 95 under the area where the board terminals are positioned. In this manner, the boards are preheated prior to the reflow solder operation. Thus, proper reflowing of the solder, without unduly stressing the circuit components being soldered.

As illustrated in FIGS. 1, 2 and 3, the suction head 50 of the gripper assembly 45, generally includes a stepped section 100, for shaping the cable 22 in a complementary shaped stepped configuration. As shown in FIG. 4, the head 50 includes a stepped section 100, which defines a series of generally horizontal shoulders 102, 104 and 106 for receiving the forward end of the cable 22. The stepped section 100 further includes two elongated upright suction openings 107 and 109, covered over by respective perforate screens 107A and 109A, extending generally throughout substantially the entire area of the respective shoulders 102 and 104.

The suction opening 107 retains the forwardmost portion of the cable 22 in a generally flat configuration against the shoulder 102. Similarly, the suction opening 109 at the shoulder 104 retains a portion of the cable 22 in a flat position against the shoulder 104. The adjacent rearward portion of the cable 22 naturally assumes a position in a substantially flat configuration against the shoulder 106.

Thus, as shown in FIG. 4, the forward end of the cable 22 assumes a natural stepped configuration in its natural, unstressed condition, while in the nested configuration relative to the gripper assembly. In this manner, the ribbon cable does not tend to resist its being held in the desired position as shown in FIG. 4.

As illustrated in FIG. 2, the pneumatic mechanism 53 generally includes a substantially flat block 114 that interconnects, and that is disposed intermediate, the stepped section 100 and a piston rod 115, for moving reciprocatively the gripper assembly 45 in a generally vertical direction.

Considering now the monitor assembly 60 in greater detail with respect to FIG. 1, it generally includes an illumination assembly generally indicated at 117 for illuminating the cable 22 and the printed circuit boards 15 and 17 being soldered. The illuminating assembly 117 generally includes two light sources 118 and 119, which are generally oppositely disposed relative to the printed circuit boards 15 and 17 for directing light thereon. The light sources 118 and 119 are disposed within the housing assembly 75. An elongated generally flat mounting plate 126 is secured inside the housing 75 in a substantially horizontal position above the fixture or assembly 30, for supporting from above the light sources 118 and 119, as well as the gripper assembly 45, the heater assembly 65 and the pick and place device 76.

The monitor assembly 60 further includes a video camera 120 having an adjustable zoom lens 122, and the monitor 130, for observing continuously the soldering operation, as well as for monitoring the alignment of the leads 26 and terminals 20. The lens 122 is directed at approximately a 45° angle downwardly onto the fixture or assembly 30, so as to visualize the alignment of the cable conductor leads and the board terminal. The zoom lens 122 magnifies the area being monitored, and can be adjusted for coarse as well as fine alignments between the leads 26 and the terminals 20. Thus, by monitoring visually the immediate area of concern, prior to reflowing the solder material and binding the leads 26 and terminals 20, the user can adjust the holding fixture or assembly 30 in the desired direction, by means of the knobs 37 and 39, and the joystick 35, so as to obtain an optimal alignment between the leads 26 and the terminals 20.

Figure 6:
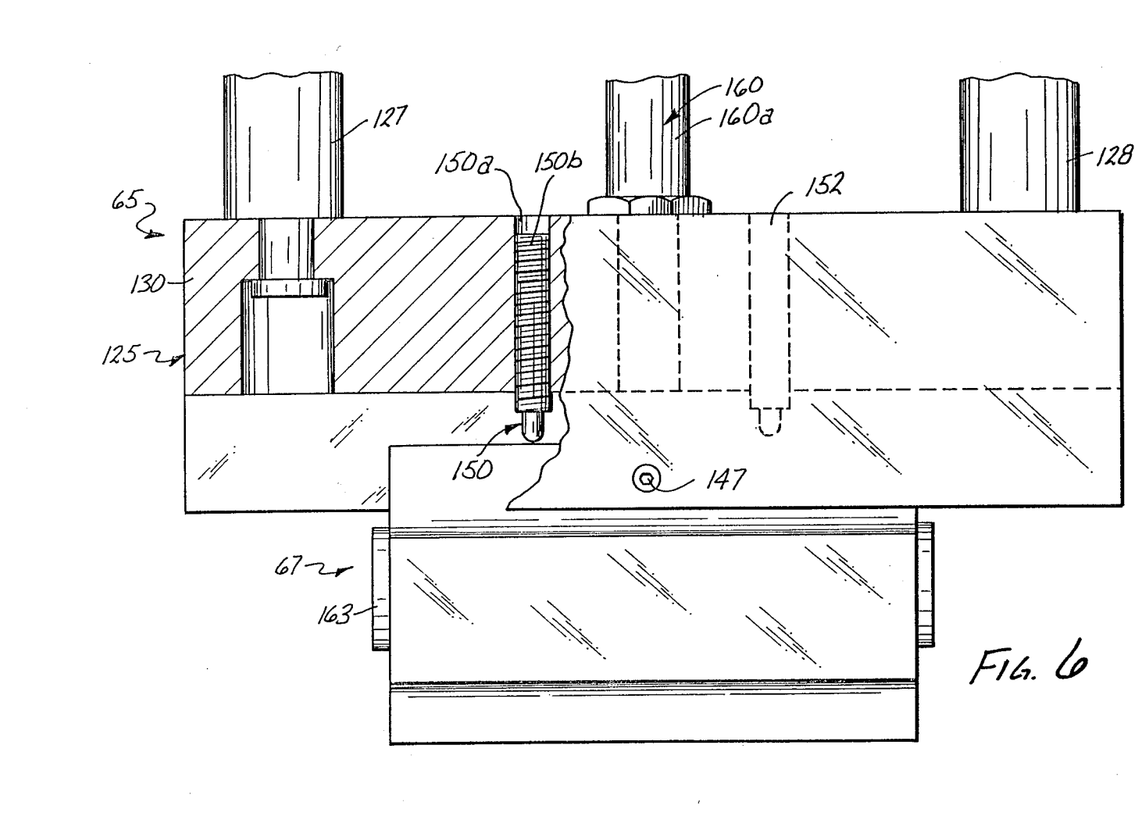
FIG. 6 is a greatly enlarged, partially broken away rear elevational view of the heater assembly of FIG. 5.

Considering now the heater assembly 65 in greater detail with respect to FIGS. 5 and 6, it generally includes a gimbal mount 125 that is connected pivotally to the floating gimballed head 67. The gimbal mount 125 includes an elongated substantially U-shaped bifurcated mounting block 130 for receiving partially, and for engaging pivotally the gimballed head 67. The mounting block 130 includes two leg portions 133 and 135, and an interconnecting bight portion 137.

For the purpose of causing the gimballed head 67 to be connected pivotally to the gimbal mount 125, a pair of similar jewelled pivots 145 and 147 secure a neck portion 67A of the head 67 between the leg portions 133 and 135. The pivots 145 and 147 are positioned in alignment relative to one another, and fit into corresponding apertures 145A and 147A in the gimballed head 67.

The mounting block 130 houses a pair of similar spring-loaded plungers 150 and 152 engage the top edge of the neck portion 67A on opposite side of the pivots 145 and 147 to urge the head 67 resiliently into a horizontal disposition. Each one of the plungers such as the plunger 150, fits into an opening, such as the opening 150A, in the gimbal mount, and has a coil spring, such as the spring 150B, for urging axially its plunger out of the opening toward the head 67.

Thus, in the event the board 15 is not disposed in the desired flat, horizontal position, and one end thereof is raised relative to the opposite end, the floating gimballed head 67 pivots relative to the pivots 145 and 147 so as to come to rest flat against the board 15. The gimballed head 67, permits the uniform application of heat for reflowing and distributing the solder material evenly onto the leads 26 and the terminals 20.

The gimbal mount 125 is connected fixedly to the bottom ends of a pair of substantially similar spaced-apart guide posts 127 and 128, for guiding the movement of the heater assembly 65 in a generally vertical movement. The posts 127 and 128 are disposed symmetrically on opposite ends of the jewelled pivots 145 and 147, in order to insure the vertical movement of the heater assembly 65.

An upright piston cylinder assembly 160 has the lower end of its piston 160A fixedly connected to the central portion of the mounting block 130 intermediate the guide posts 127 and 128, and the spring plungers 150 and 152, for raising and lowering the block 130 relative to the assembly 30.

Considering now the gimballed head 67 in greater detail with respect to FIGS. 5 and 6, the head 67 is composed of heat conductive material, such as metal or ceramic material. A heating element 163 is disposed within the head 67 to heat it to a sufficient temperature to render solder molten. A thermal couple 165 controls the temperature of the head 67.

A depending edge portion 166 has a dam 167 depends downwardly at one corner edge of the portion 166, in order to protect the printed circuit board 15 from excess molten solder material from dripping thereon.

Once the solder bead is rendered molten, and the leads 26 and terminals 20 are thereafter permitted to cool and thus harden, a negative suction pressure is applied to the comb 66 through the suction port (not shown) for causing it to be detached from the cable conductors. A positive pressure is thereafter applied to the comb 66 to cause it to be discharged from the gripper assembly 45 for ejecting it from the gripper assembly.

When the foregoing soldering cycle has ended, and it is desired to solder the conductor ends of the cable 22 to the terminals of the board 17, the turntable 95 is rotated 180 degrees in the $\theta_z$ direction about its central axis, in response to manual movement of the joystick 35. In this manner, the boards 15 and 17, and the cable 22 does not have to be remounted. Thus, a substantial amount of time is saved, and the soldering operation is rendered more efficient and cost effective.

As illustrated in FIG. 1, a control panel 175 supports the moveably mounted joystick 35, and includes a plurality of control switches, such as the switches 182, 183, 184, and 185, and a plurality of gauges, such as the gauge 190, for controlling substantially the entire soldering operation. In this manner, the zoom lens 122 can be adjusted remotely, for providing the required magnification. Similarly, the video camera 120 can be focused, and the contrast and brightness levels thereof can be adjusted.

The control panel 175 further enables the adjustment of the position of the gripper assembly 45. For instance, the switch 185 can be designed to cause the lowering of the gripper assembly to any of its three positions, such as the hover position.

The solder reflow process is also controlled from the control panel 175. In this regard, the heating temperature of the heating element 163 can be monitored by the gauge 190, and can be varied by a switch, such as the switch 184. Additionally, the heating and cooling times of the molten solder material can also be controlled from the control panel 175. For illustration purposes, only a few control switches have been shown. It should, however, be understood that the various functions of the system 10 are controlled by other switches, or control devices (not shown), and are sequenced by a computer (not shown).

Figure 7:
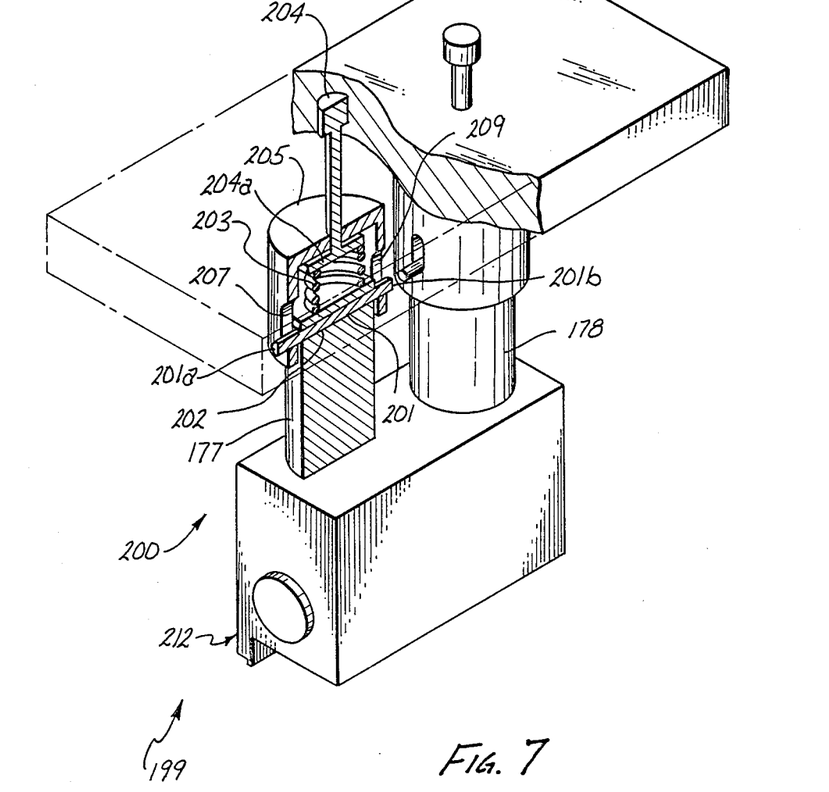
FIG. 7 is a greatly enlarged, partially broken away, front elevational sectional view of another heater assembly, forming a part of another solder system which is constructed in accordance to the present invention.

Turning now to FIG. 7, there is illustrated a portion of another solder system 199, which is constructed in accordance with the present invention, and which includes a heater assembly 200. The system 199 is substantially similar in function to the solder head 67, except that the heater assembly 200 includes a pair of spring plungers 177 and 178. The plungers 177 and 178 are each spring loaded, and the spring tension is adjustable. In this manner, the heater assembly 200 includes a resolder head 212, which is generally similar to the head 67 of the system 10, and which is supported from above by the pair of spring loaded plungers 177 and 178.

The spring plungers 177 and 178 are substantially similar in design and construction, and therefore, only the spring plunger 177 will be described hereinafter in greater detail. The spring plunger 177 has a transverse pin or rod 201, which extends through a cross hold 202 in the upper portion of the plunger 177, and which has its distal ends 201A and 201B extending from the plunger 177 into vertically elongated openings or slots 207 and 209, respectively, of an upper cup-shaped hollow elongated tubular cap 205. A spring 203 is positioned above the plunger 177 and a head 204A of a rotatably mounted stem or rod 204, which can be rotated manually to vary the tension of the spring 203 according to the particular application of the solder system 10.

In operation, when the head 212 is lowered into engagement with a board (not shown), the rod 201 moves adjustably in the Z direction within the slots or openings 207 and 209, in opposition to the tension of the spring 203. The spring tension can be adjusted by manual rotation of the stem 204 for variations of board thickness or the like.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A system adapted for use in connecting the electrical conductors of a first member to the electrical conductors of a second member, comprising:
    holding means for supporting adjustably the first member, relative to the second member;
    rectilinear movement means for causing relative movement in a rectilinear downwardly-directed path between the first member and the second member into a generally aligned position;
    gripper means for holding from above the second member as the rectilinear movement means causes the second member to move downwardly to a position above the first member;
    means for monitoring the alignment of the conductors of the first member relative to the conductors of the second member as said rectilinear movement means causes further rectilinear downward movement to cause the engagement of the conductors of the first member with the conductors of the second member;
    connecting means for connecting the conductors of the first member to the conductors of the second member;
    said gripper means including a gimballed floating head for releasing subsequently the second member, and said rectilinear movement means for retracting subsequently reciprocally along said rectilinear path of travel; and
    wherein said connecting means is soldering means that includes a gimballed floating head.

2. A system according to claim 1, wherein said holding means is provided with at least two degrees of movement.

3. A system according to claim 2, wherein said holding means is provided with three degrees of movement.

4. A system according to claim 1, wherein said gripper means is positioned adjustably above the first member.

5. A system according to claim 1, wherein said monitoring means includes an illumination device, a video camera and a video monitor.

6. A system according to claim 1, further including a pick and place device for connecting surface mounted component on the first member.

7. A system according to claim 1, further including means for housing said holding means, said gripper means, and said connecting means.

8. A system according to claim 4, wherein said gripper means includes a suction mechanism for applying negative pressure to the second member to retain it securely.

9. A system according to claim 3, wherein said holding means including a base plate for supporting the first member.

10. A system according to claim 9, wherein said holding means further includes a power driven X-table and a power driven Y-table.

11. A system according to claim 5, wherein said video camera includes a lens, further including means for mounting said camera to direct said lens at an angle downwardly toward said holding means.

12. A system according to claim 1, wherein said holding means includes preheating means for preheating the conductors of the first member.

13. A system according to claim 12, wherein said preheating means is a pair of heating rods.

14. A system according to claim 1, further comprising housing means for protecting said gripper means;
    said housing means being disposed over and partially covering said gripper means.

15. A system according to claim 14 wherein said housing means is a bridge-like structure covering said gripper means.

16. A system adapted for use in connecting the electrical conductors of a first member to the electrical conductors of a second member, comprising:
    holding means for supporting adjustably the first member, relative to the second member said holding means includes preheating means for preheating the conductors of the first member;

rectilinear movement means for causing relative movement in a rectilinear downwardly-directed path between the first member and the second member into a generally aligned position;

gripper means for holding from above the second member as the rectilinear movement means causes the second member to move downwardly to a position above the first member;

means for monitoring the alignment of the conductors of the first member relative to the conductors of the second member as said rectilinear movement means causes further rectilinear downward movement to cause the engagement of the conductors of the first member with the conductors of the second member;

soldering means for connecting the conductors of the first member to the conductors of the second member; and said gripper means for releasing subsequently the second member, and said rectilinear movement means for retracting subsequently reciprocally along said rectilinear path of travel.

17. A system adapted for use in connecting a series of terminals of a circuit board to a corresponding series of leads of a cable, comprising:

holding means for supporting adjustably the circuit board, relative to the cable;

means for gripping the cable, to retain it in position above the board;

means for monitoring the alignment of the board terminals and cable leads; and a gimballed floating head for connecting the board terminals and the cable leads, mounted adjustably above said holding means.

18. A system according to claim 17, wherein said gimballed head further includes a gimbal mount that is connected pivotally to said gimballed head.

19. A solder system according to claim 18, wherein said gimbal mount houses a pair of substantially similar spring plungers that are transversely symmetrically orthogonally disposed relative to said gimballed head.

20. A system adapted for use in connecting a series of terminals of a circuit board to a corresponding series of leads of a cable, comprising:

holding means for supporting adjustably the circuit board, relative to the cable;

means for gripping the cable, to retain it in position above the board, said gripping means being positioned adjustably above the board having a suction mechanism for applying negative pressure to the cable to retain it securely and a stepped section for causing the cable to be shaped into a complementary shaped stepped configuration;

means for monitoring the alignment of the board terminals and cable leads; and means for connecting the board terminals and cable leads, mounted adjustably above said holding means.

21. A solder system according to claim 20, wherein said suction mechanism includes a pair of suction openings.

22. A solder system according to claim 21, wherein said gripping means further includes a pneumatic mechanism.

23. A system adapted for use in connecting the electrical conductors of a first member to the electrical conductors of a second member, comprising:

holding means for supporting adjustably the first member, relative to the second member;

rectilinear movement means for causing relative movement in a rectilinear downwardly-directed path between the first member and the second member into a generally aligned position;

gripper means for holding from above the second member as the rectilinear movement means causes the second member to move downwardly to a position above the first member;

means for monitoring the alignment of the conductors of the first member relative to the conductors of the second member as said rectilinear movement means causes further rectilinear downward movement to cause the engagement of the conductors of the first member with the conductors of the second member;

connecting means for connecting the conductors of the first member to the conductors of the second member;

said gripper means including a gimballed floating head for releasing subsequently the second member, and said rectilinear movement means for retracting subsequently reciprocally along said rectilinear path of travel;

wherein said means for connecting the conductors of the first member to the conductors of the second member is soldering means that includes a gimballed floating head; and wherein said soldering means further includes a gimbal mount that is connected pivotally to said gimballed head.

24. A system according to claim 23, wherein said gimbal mount houses a pair of substantially similar spring plungers that are transversely symmetrically orthogonally disposed relative to said gimballed head.

* * * * *